United States Patent
Olson

(10) Patent No.: US 8,014,157 B2
(45) Date of Patent: Sep. 6, 2011

(54) CIRCUIT BOARD MOUNTING SYSTEM

(75) Inventor: Steven C. Olson, Broomfield, CO (US)

(73) Assignee: ARC Wireless Solutions, Inc., Wheat Ridge, CO (US)

( * ) Notice: Subject to any disclaimer, the term of this patent is extended or adjusted under 35 U.S.C. 154(b) by 531 days.

(21) Appl. No.: 12/236,732

(22) Filed: Sep. 24, 2008

(65) Prior Publication Data

US 2010/0073889 A1   Mar. 25, 2010

Related U.S. Application Data

(60) Provisional application No. 60/976,537, filed on Oct. 1, 2007.

(51) Int. Cl.
  H05K 5/00   (2006.01)
  H05K 3/30   (2006.01)
  H05K 7/12   (2006.01)
  H05K 1/14   (2006.01)
  H05K 7/10   (2006.01)
  H05K 7/02   (2006.01)
  H05K 7/04   (2006.01)

(52) U.S. Cl. ........ 361/752; 361/807; 361/742; 361/770; 174/138 G

(58) Field of Classification Search .......... 361/807, 361/810, 800, 752, 730, 804, 758, 770, 742; 174/138 E, 138 G
See application file for complete search history.

(56) References Cited

U.S. PATENT DOCUMENTS

| | | | |
|---|---|---|---|
| 4,229,778 A | 10/1980 | Williams et al. | |
| 4,291,867 A | 9/1981 | Williams et al. | |
| 5,067,648 A | 11/1991 | Cascini | |
| 5,218,753 A | 6/1993 | Suzuki | |
| 5,438,740 A | 8/1995 | Carr | |
| 5,452,184 A * | 9/1995 | Scholder et al. | 361/799 |
| 5,815,912 A | 10/1998 | Willshere | |
| 6,215,667 B1 | 4/2001 | Ady et al. | |
| 6,424,537 B1 * | 7/2002 | Paquin et al. | 361/752 |
| 6,695,629 B1 * | 2/2004 | Mayer | 439/92 |
| 6,813,161 B2 * | 11/2004 | Le et al. | 361/758 |
| 7,034,223 B2 * | 4/2006 | Fan et al. | 174/51 |
| 7,184,277 B2 * | 2/2007 | Beirne | 361/807 |
| 7,212,400 B2 * | 5/2007 | Fan et al. | 361/679.58 |
| 7,876,569 B2 * | 1/2011 | Xue | 361/759 |
| 2004/0196637 A1 | 10/2004 | Le et al. | |
| 2007/0064404 A1 * | 3/2007 | Dean | 361/810 |

* cited by examiner

*Primary Examiner* — Lisa Lea-Edmonds
*Assistant Examiner* — Xanthia Cunningham
(74) *Attorney, Agent, or Firm* — Ancel W. Lewis, Jr.

(57) ABSTRACT

A circuit board mounting system has a mounting plate and standoffs. The mounting plate has several parallel slits. The standoffs have a base with an elongated slot and an upright post. Fasteners through the slot mount the standoffs anywhere along the slits. The standoffs can rotate around the fasteners and translate relative to the fasteners before the fasteners are tightened, so that a post can be located anywhere on the mounting plate. Circuit boards are mounted to the tops of the standoff posts.

21 Claims, 6 Drawing Sheets

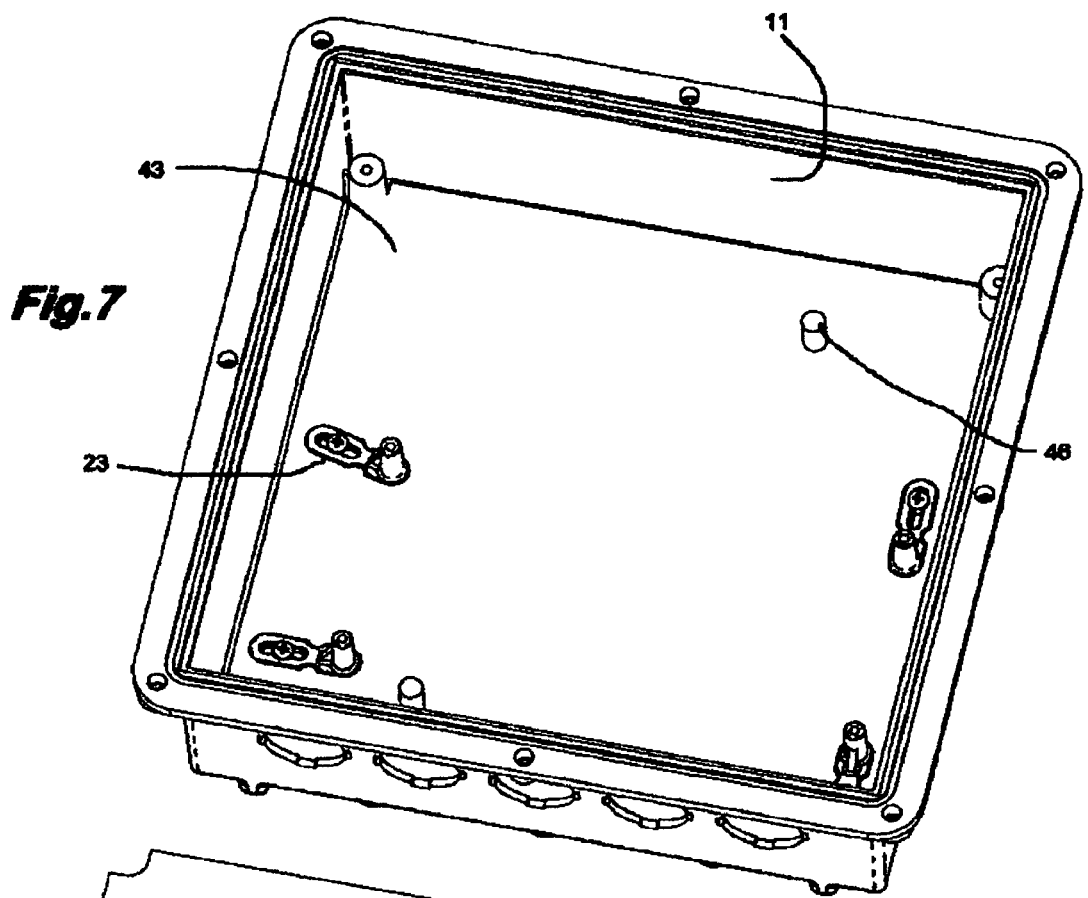
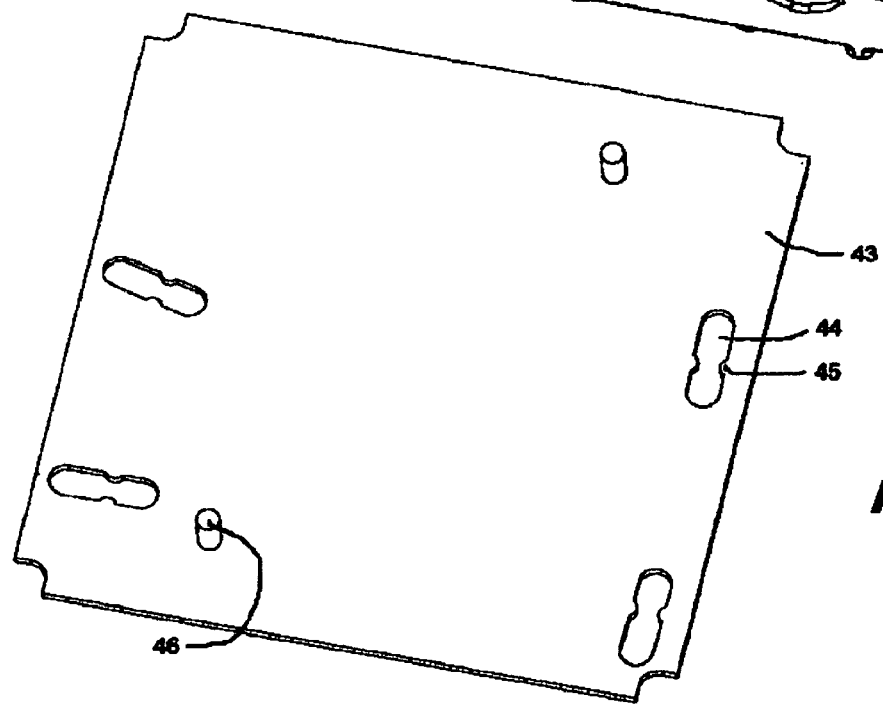

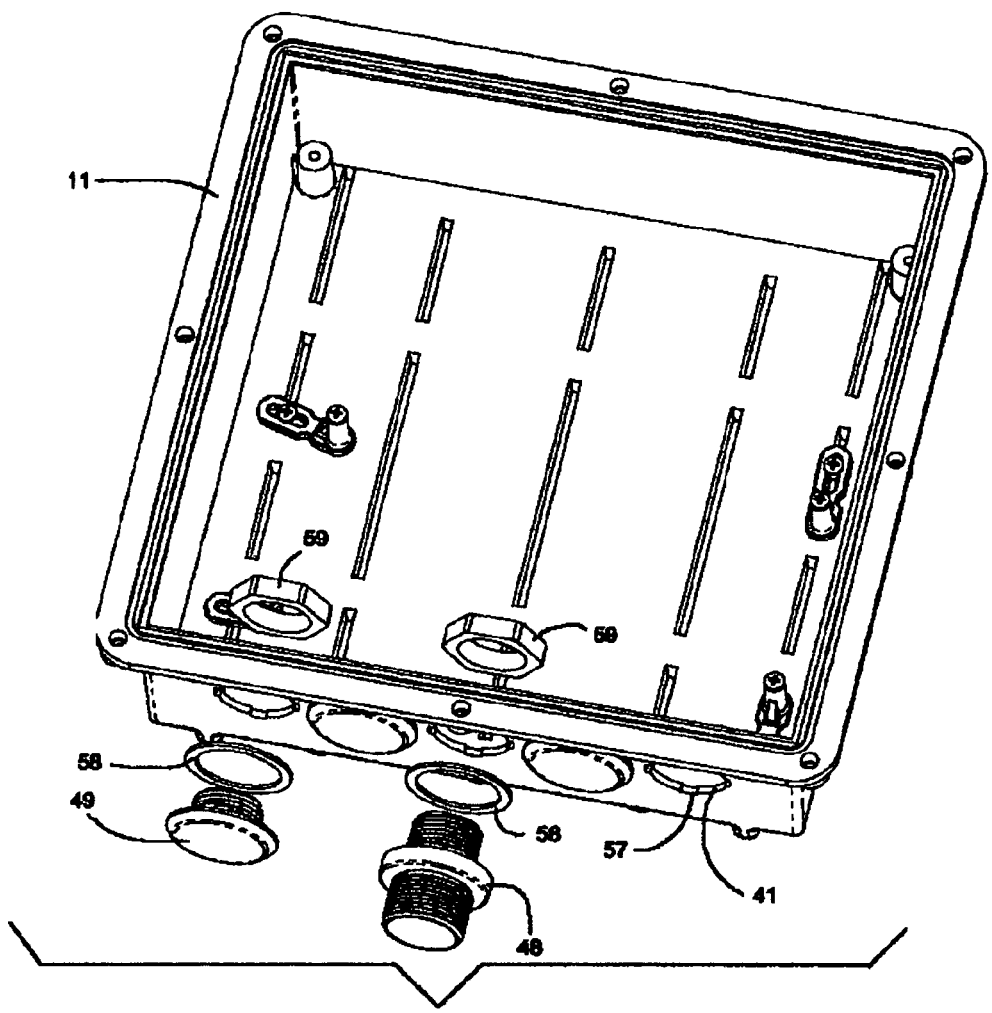
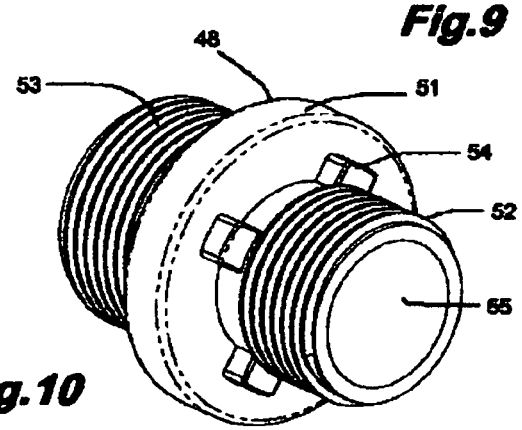
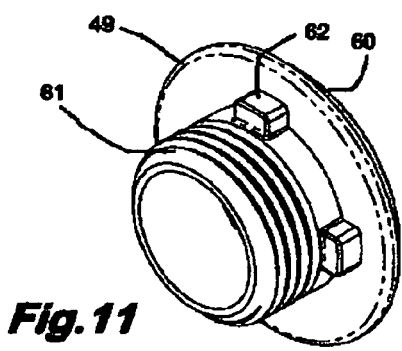
Fig.9
Fig.10
Fig.11

US 8,014,157 B2

CIRCUIT BOARD MOUNTING SYSTEM

This application claims the benefit under 35 U.S.C. §119(e) of the U.S. provisional patent application No. 60/976,537 filed Oct. 1, 2007.

TECHNICAL FIELD

The present invention relates to circuit board mounting systems and more particularly to a system for mounting circuit boards of varying sizes and with varying connector locations, with the connectors aligning with a limited number of ports.

BACKGROUND ART

Radio boards for fixed wireless access are mounted and housed in enclosures. No industry standards exist that define the board size and specific mounting hole patterns for radio boards. Constantly changing radio board requirements often necessitate changing the mounting hole locations on the radio board, resulting in the need to implement a mounting method that can quickly adapt to such changes without continuously making tool changes to the radio housing.

Each radio board has at least one communication interface connector which carries either radio frequency (RF) or digital signals. The communication interface cable extends through a port in a face of the enclosure with a grommet system that seals around the communication interface cable. For efficient enclosure installation in the field, the communication interface connector should be aligned with the port so that the communication interface cable can be directly plugged into the communication interface connector through the grommet system. No industry standards exist that define the location of the connector on the radio board.

DISCLOSURE OF THE INVENTION

A circuit board mounting system includes a mounting plate, a plurality of standoffs, and a fastener for each standoff. The mounting plate has a plurality of spaced mounting slits. Each standoff has a base and a post that extends transverse to the base near one end of the base. The base of each standoff has an elongated aperture.

BRIEF DESCRIPTION OF THE DRAWINGS

Details of this invention are described in connection with the accompanying drawings that bear similar reference numerals in which:

FIG. 7 is a top perspective view of the enclosure of FIG. 1 with an alignment plate installed.

FIG. 8 is a top perspective view of the alignment plate of FIG. 7.

FIG. 9 is a top perspective view of the enclosure of FIG. 1 with a port adapter and a plug shown in exploded view.

FIG. 10 is a back perspective view of a port adapter for the enclosure of FIG. 1.

FIG. 11 is a back perspective view of a plug for the enclosure of FIG. 1.

DETAILED DESCRIPTION OF THE INVENTION

Figure 1:
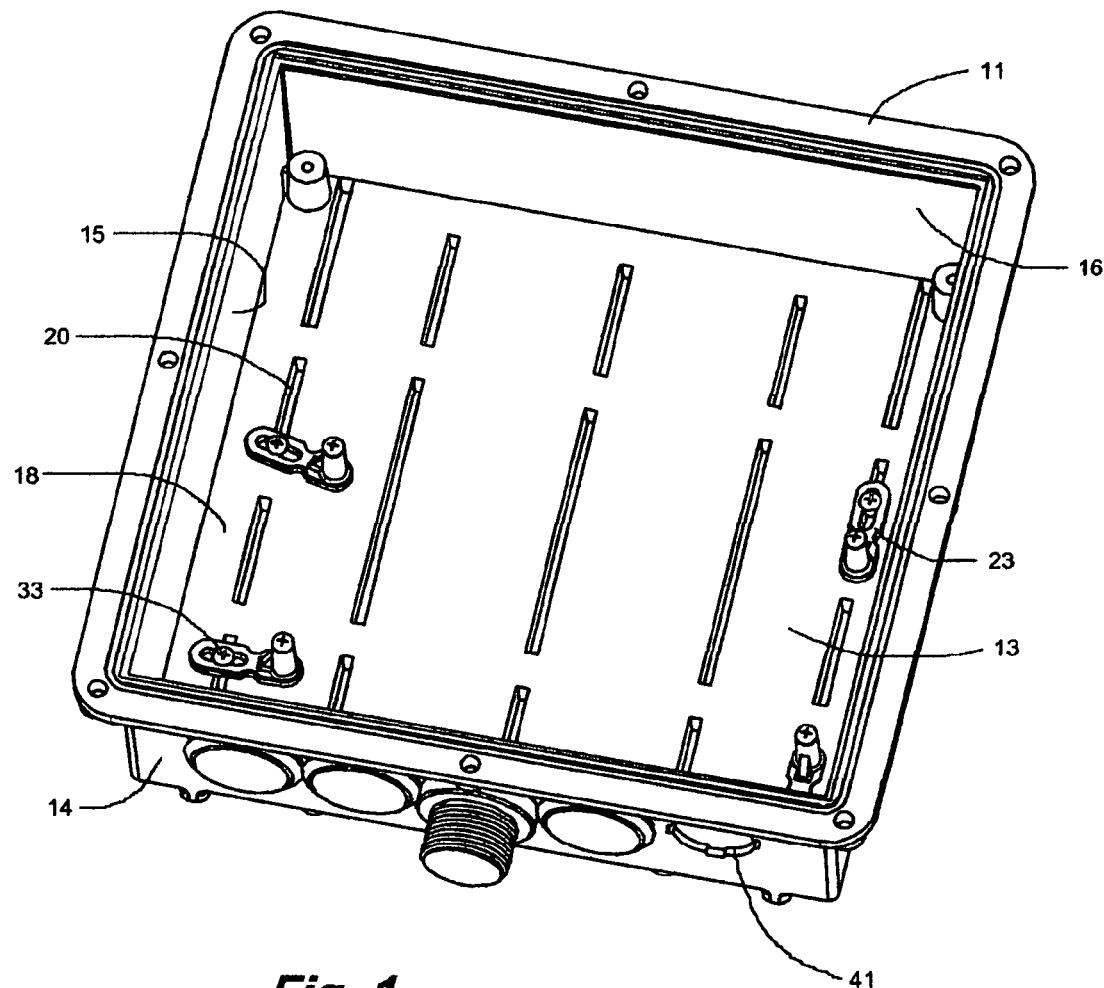
FIG. 1 is a top perspective view of a radio board enclosure with a circuit board mounting system embodying features of the present invention.

Referring now to FIGS. 1 to 4, a radio board enclosure 11 has a generally open top, box shape with a bottom 13, a front wall 14 projecting up from the front of the bottom 13, spaced, opposed side walls 15 extending rearwardly from opposite ends of the front wall 14, and a back wall 16 extending between the back ends of the side walls 15. An enclosure top, not shown, is provided with the enclosure 11 to seal the enclosure 11 from the environment. Such an enclosure top can include an antenna.

Describing the specific embodiments herein chosen for illustrating the invention, certain terminology is used which will be recognized as being employed for convenience and having no limiting significance. For example, the terms "top", "bottom", "front" and "back" will refer to directions with reference to the Figures. Further, all of the terminology above-defined includes derivatives of the word specifically mentioned and words of similar import.

The bottom 13 forms a mounting plate 18. Alternatively, a separate mounting plate 18 that mounts on bottom 13 could be provided. The mounting plate 18 has a plurality of spaced, parallel slits 20. In the illustrated embodiment the slits 20 are cast into the bottom 13 and form ribs 21 that project downwardly from the bottom 13. Alternatively, the slits 20 can be cast to form ribs 21 that project upwardly from the bottom 13 into the enclosure 11. Also, instead of the slits 20, the mounting plate 18 could have an array of holes.

Figure 5:
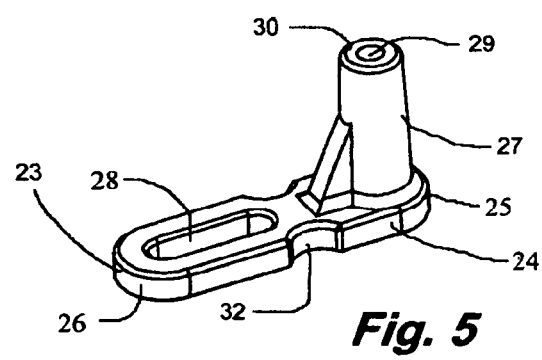
FIG. 5 is an enlarged perspective view of a standoff for the enclosure of FIG. 1.
Figure 2:
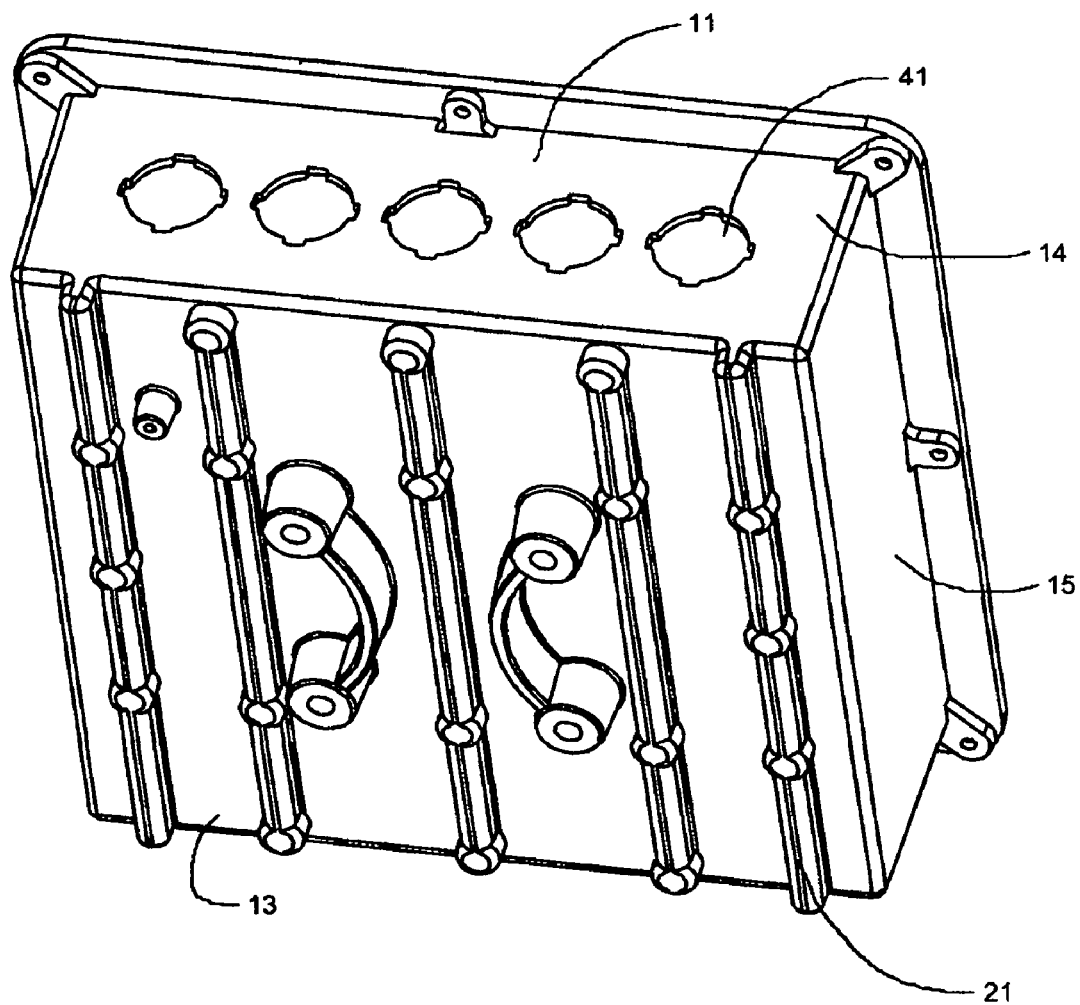
FIG. 2 is a bottom perspective view of the enclosure of FIG. 1.
Figure 3:
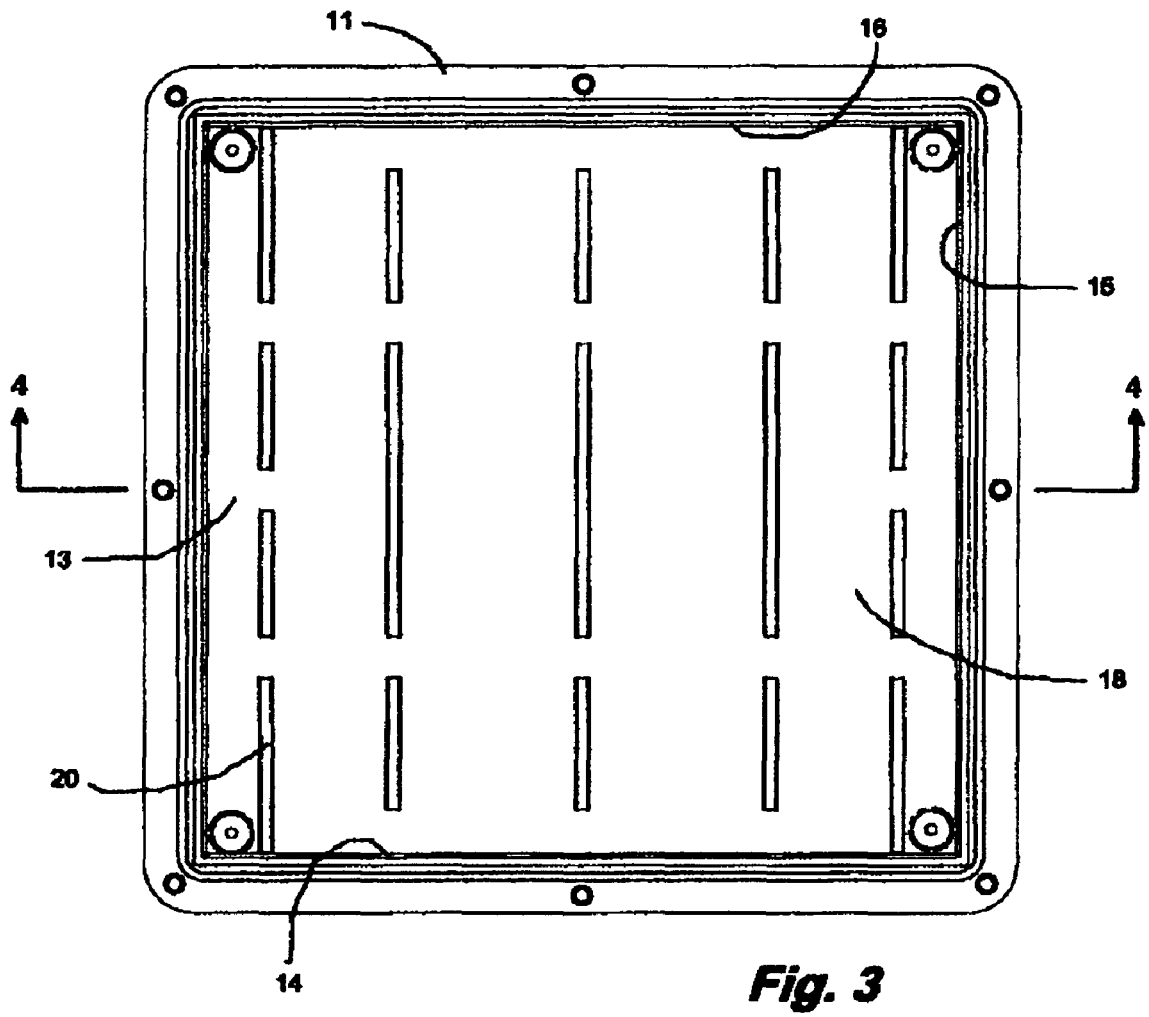
FIG. 3 is a top elevation view of the enclosure of FIG. 1.
Figure 4:
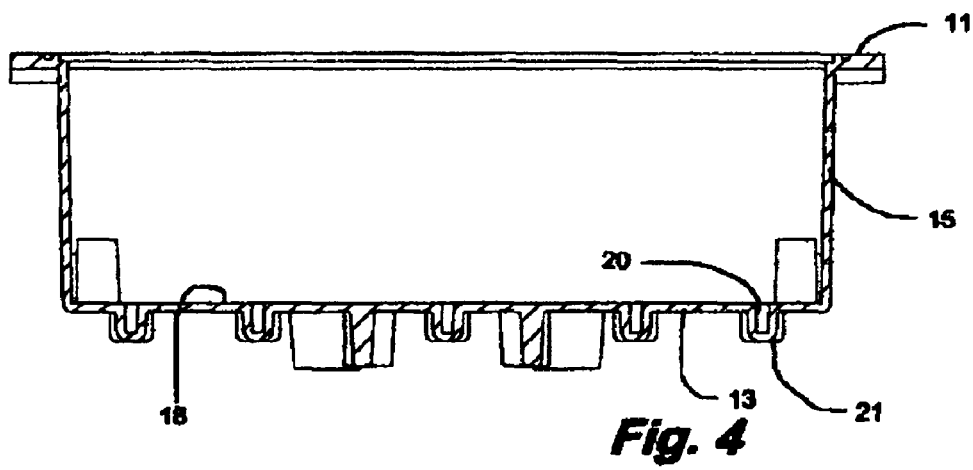
FIG. 4 is a cross sectional view of the enclosure of FIG. 1 taken along line 4-4 of FIG. 3.

FIG. 5 shows a standoff 23 having a substantially flat, elongated oval base 24 with a first end 25 and a spaced second end 26, and a cylindrical post 27 projecting upwardly from the first end 25 of the base 24. An elongated standoff aperture 28 extends through the base 24 between the post 27 and the second end 26 of the base 24. A hole 29 extends downwardly from the top 30 of the post 27. A pair of locating indentations 32 are relieved into opposite sides of the base 24, between the post 27 and standoff aperture 28. The distance from the locating indentations 32 to the first end 25 of the base 24 is different from the distance from the locating indentations 32 to the second end 26 of the base 24, making the locating indentations 32 off center and making the base 24 non-symmetrical.

The standoff 23 shown is cast. Alternatively, the standoffs 23 can be assembled with the base 24 being stamped out and the post 27 being pressed into or otherwise secured to the base 24. The standoffs 23 can be made of metal or can be non-conductive material such as plastic.

As shown in FIG. 1, standoff fasteners 33 extend through the standoff apertures 28 and into slits 20 in the mounting plate 18 to secure the standoffs 23 to the mounting plate 18. The standoff fasteners 33 can be assembled anywhere along the slits 20, the standoffs 23 can be rotated around the standoff fasteners 33 and the posts 27 can be moved towards or away from the standoff fasteners 33 due to the elongated standoff apertures 28, so that a post 27 can be located anywhere on the mounting plate 18.

Figure 6:
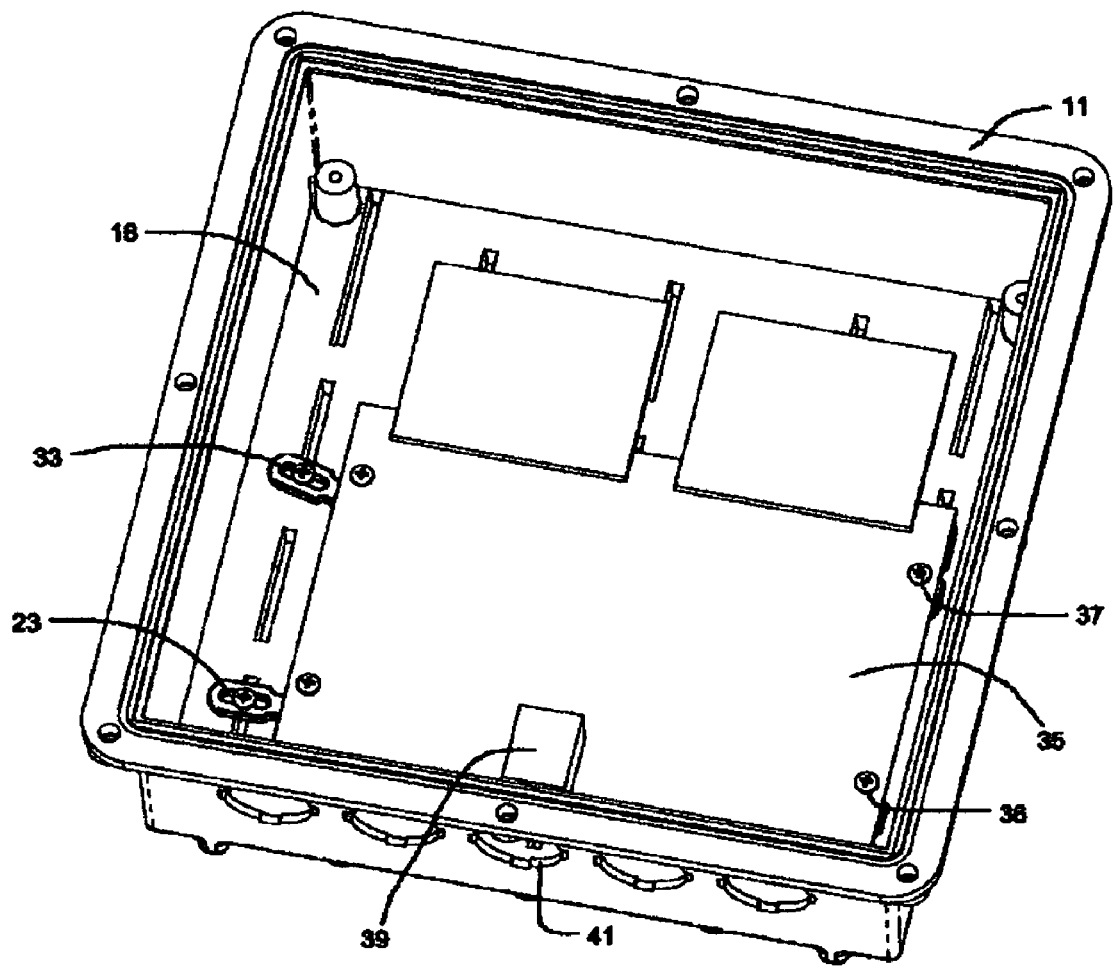
FIG. 6 is a top perspective view of the enclosure of FIG. 1 with a radio board installed.

FIG. 6 shows the enclosure 11 with a radio board 35. The radio board 35 is generally rectangular and has a mounting hole 36 in each corner. Four standoffs 23 are mounted on the mounting plate 18, and a threaded board fastener 37 extends through the mounting hole 36 in each corner of the radio board 35 and into the hole 29 in a post 27 of a standoff 23 to mount the radio board 35 on the mounting plate 18. The board fasteners 37 shown are screws, however other board fasteners 37 can be used. A communication interface connector 39 for connection to a communication interface cable is mounted on the forward edge of the radio board 35.

The size of the radio board 35 and the location of the communication interface connector 39 along the forward edge of the radio board 35 varies between different manufacturers of radio boards 35. The front wall 14 shown of the enclosure 11 includes five spaced ports 41. Other numbers of ports 41 can be provided. The mounting plate 18 with the slits 20 and the standoffs 23 that can rotate and translate allow the communication interface connector 39 to be aligned with one of the ports 41, for different sized radio boards 35 with communication interface connectors 39 at different locations along the forward edge of the radio board 35. During installation of the enclosure 11, alignment of the communication interface connector 39 with a port 41 allows connection of a communication interface cable without opening the enclosure 11.

Referring to FIGS. 7 and 8, an alignment plate 43 is a flat plate sized and shaped to fit into the enclosure 11 against the bottom 13. The alignment plate 43 includes four openings 44, each sized and shaped to receive the base 24 of a standoff 23. For each opening 44, the alignment plate 43 has a pair of opposed projections 45. The projections 45 are sized and located to extend into the locating indentations 32 of the base 24 of the standoff 23. The alignment plate 43 shown also includes a pair of posts 46 that project upwardly.

An alignment plate 43 can be provided for each different model or configuration of radio board 35. The alignment plate 43 is inserted into the enclosure 11 and the standoffs 23 are then assembled to the mounting plate 18. Since the locating indentations 32 are off center relative to the base 24, the locating indentations 32 of the base 24 of the standoff 23 and the projections 45 in the openings 44 of the alignment plate 43 prevent reversal of the standoff 23. The posts 46 on the alignment plate 43 are grasped to remove the alignment plate 43. Other non-symmetrical shapes of the base 24 of the standoffs 23 can also be used to prevent reversal of the standoffs 23. The alignment plate 43 provides efficient assembly of the standoffs 23.

FIG. 9 shows the enclosure 11 with an exploded view of a port adapter 48 and a plug 49. Referring to FIG. 10, the port adapter has a hollow, cylindrical intermediate portion 51, a hollow, externally threaded, cylindrical back portion 52 extending rearwardly from the intermediate portion 51, and a hollow, externally threaded, cylindrical front portion 53 extending forwardly from the intermediate portion 51. The diameter of the intermediate portion 51 is larger than the diameters of the back and front portions 52 and 53. Four circumferentially spaced, substantially rectangular projections 54 extend radially outwardly from the back portion 52 adjacent to the intermediate portion 51. A cylindrical cavity 55 extends through the port adapter 48.

Referring again to FIG. 9, each port 41 is a circular opening sized and shaped to receive the back portion 52 of the port adapter 48, and has four circumferentially spaced, substantially rectangular notches 57 that extend radially outwardly. The notches 57 are sized, shaped and located to receive the projections 54 on the port adapter 48. The port adapter 48 is assembled to the enclosure 11 with a washer 58 between the intermediate portion 51 and the front wall 14, the back portion 52 extending through the port 41, and the projections 54 in the notches 57. A nut 59 threads onto the back portion 52 from the interior of the enclosure 11 to secure the port adapter 48. The projections 54 and notches 57 prevent rotation of the port adapter 48 so that a grommet system can be threaded onto and unthreaded from the front portion 53 without loosening the port adapter 48.

Referring to FIG. 11, a plug 49 has substantially flat, circular front portion 60 and an outwardly threaded, cylindrical back portion 61 extending rearwardly from the front portion 60. The diameter of the front portion 60 is larger than the diameter of the back portion 61. Four circumferentially spaced, substantially rectangular projections 62 extend radially outwardly from the back portion 61 adjacent to the front portion 60. The plug 49 is assembled to the enclosure 11 with a washer 58 between the front portion 60 and the front wall 14, the back portion 61 extending through the port 41, and the projections 62 in the notches 57. A nut 59 threads onto the back portion 61 from the interior of the enclosure 11 to secure the plug 49. The projections 62 and notches 57 prevent rotation of the plug 49. The plug 49 can be made of a transparent or translucent material so that LEDs on the radio board 35 can be visible from outside the enclosure 11.

Although the present invention has been described with a certain degree of particularity, it is understood that the present disclosure has been made by way of example and that changes in details of structure may be made without departing from the spirit thereof.

What is claimed is:

1. A system for mounting a circuit board comprising:
   a mounting plate having a plurality of parallel, spaced slits,
   a plurality of standoffs each having an elongated base with a first end and a spaced second end, and a post that projects upwardly from said first end of said base, said base having a standoff aperture that extends through said base between said post and said second end of said base, and
   a standoff fastener for each said standoff, said standoff fastener being sized to extend through said standoff aperture and into one of said slits to fasten said standoff to said mounting plate,
   whereby said standoffs can be mounted anywhere along said slits and rotated about said fasteners to mount a plurality of sizes of circuit board with a plurality of locations of mounting holes.

2. The system as set forth in claim 1 wherein said standoff apertures are elongated,
   whereby said posts can be moved towards or away from said standoff fasteners.

3. The system as set forth in claim 1 wherein said post on said standoff has a top and a hole extending downwardly from said top for receiving a board fastener for securing said circuit board to said top of said standoff.

4. The system as set forth in claim 1 including an alignment plate sized and shaped to fit over said mounting plate and having an opening for each said standoff, said openings being sized and shaped to receive said base of said standoffs,
   whereby said alignment plate is placed over said mounting plate, said bases of said standoffs are placed in said openings, and said bases are fastened to said mounting plate with said standoff fasteners to align said standoffs and precisely locate said circuit board.

5. The system as set forth in claim 4 wherein said base of each said standoff has a non-symmetrical shape and each said opening has a shape to match said base,
   whereby reversal of said standoffs is prevented.

6. The system as set forth in claim 5 wherein said base of each said standoff has at least one locating indentation off-center relative to said base, such that the distance from said locating indentation to said first end is different from the distance from said locating indentation to said second end, and said alignment plate has a projection for each said opening to match said locating indentation,
    whereby said locating indentation and said projection prevent reversal of each said standoff.

7. The system as set forth in claim 1 including an enclosure for said circuit board with said mounting plate being a bottom for said enclosure, said enclosure having a front wall projecting upwardly from said bottom, spaced, opposed side walls projecting upwardly from said bottom and extending rearwardly from said front wall, and a back wall projecting upwardly from said bottom and extending between said side walls, said front wall having a plurality of spaced ports,
    whereby a communication interface connector on said circuit board can be aligned with one of said ports.

8. The system as set forth in claim 1 wherein said slits are cast into said mounting plate and form ribs that project downwardly from said mounting plate.

9. A system for mounting a circuit board comprising:
    an enclosure having a bottom, a front wall projecting upwardly from said bottom, spaced, opposed side walls projecting upwardly from said bottom and extending rearwardly from said front wall, and a back wall projecting upwardly from said bottom and extending between said side walls, said front wall having a plurality of spaced ports, said bottom defining a mounting plate having a plurality of parallel, spaced slits,
    a plurality of standoffs each having an elongated base with a first end and a spaced second end, and a post that projects upwardly from said first end of said base, said base having an elongated standoff aperture that extends through said base between said post and said second end of said base, said base having at least one locating indentation off-center relative to said base, such that the distance from said locating indentation to said first end is different from the distance from said locating indentation to said second end, said post having a top and a hole extending downwardly from said top for receiving a board fastener for securing said circuit board to said top of said standoff,
    a standoff fastener for each said standoff, said standoff fastener being sized to extend through said standoff aperture and into one of said slits to fasten said standoff to said mounting plate, and
    an alignment plate sized and shaped to fit over said mounting plate and having an opening for each said standoff, said openings being sized and shaped to receive said base of said standoffs, said alignment plate having a projection for each said opening to match said locating indentation on said base of said standoff,
    whereby said alignment plate is placed over said mounting plate, said bases of said standoffs are placed in said openings, and said bases are fastened to said mounting plate with said standoff fasteners to align said standoffs and precisely locate said circuit board.

10. An enclosure for mounting a circuit board with a communication interface connector, comprising:
    a bottom,
    a front wall projecting upwardly from said bottom, and having a plurality of spaced ports,
    spaced, opposed side walls projecting upwardly from said bottom and extending rearwardly from said front wall,
    a back wall projecting upwardly from said bottom and extending between said side walls,
    a mounting plate sized to fit inside said front, side and back walls, said mounting plate having a plurality of spaced slits,
    a plurality of standoffs each having an elongated base with a first end and a spaced second end, and a post that projects upwardly from said first end of said base, said base having a standoff aperture that extends through said base between said post and said second end of said base, and
    a standoff fastener for each said standoff, said standoff fastener being sized to extend through said standoff aperture and into one of said slits to fasten said standoff to said mounting plate,
    whereby said standoffs can be mounted anywhere along said slits and rotated about said fasteners to mount said circuit board in said enclosure and align said communication interface connector with one of said ports.

11. The enclosure as set forth in claim 10 wherein said bottom is said mounting plate.

12. The enclosure as set forth in claim 10 including a hollow port adapter having an intermediate portion, an externally threaded back portion extending from said intermediate portion, a front portion extending from said intermediate portion opposite said back portion, and a nut sized to thread onto said back portion, said back portion being sized to fit into said ports, and said intermediate portion being sized larger than said ports,
    whereby said back portion extends through a said port and said nut threads onto said back portion opposite said intermediate portion to secure said port adapter to said front wall.

13. The enclosure as set forth in claim 12 wherein said back portion has a plurality of projections that extend radially outwardly adjacent to said intermediate portion, said front portion is externally threaded and said ports each include a plurality of notches sized, shaped and positioned to receive said projections,
    whereby said projections and notches prevent rotation of said port adapter when a grommet system is assembled onto said front portion.

14. The enclosure as set forth in claim 10:
including at least one plug having a front portion, an externally threaded back portion extending from said front portion and a nut sized to thread onto said back portion, said back portion being sized to fit into said ports, said front portion being sized larger than said ports, said back portion having a plurality of projections that extend radially outwardly adjacent to said front portion, and
wherein said ports each include a plurality of notches sized, shaped and positioned to receive said projections,
whereby said back portion extends through a said port and said nut threads onto said back portion opposite said front portion to secure said plug to said front wall, and said projections and notches prevent rotation of said plug.

15. The enclosure as set forth in claim 14 wherein said plug is made of one of a transparent and a translucent material,
    whereby an LED on said circuit board is visible through said plug from outside.

16. The enclosure as set forth in claim 10 wherein said standoff apertures are elongated,
    whereby said posts can be moved towards or away from said standoff fasteners.

17. The enclosure as set forth in claim 10 wherein said post on said standoff has a top and a hole extending downwardly from said top for receiving a board fastener for securing said circuit board to said top of said standoff.

18. The enclosure as set forth in claim 10 including an alignment plate sized and shaped to fit inside said front, side and back walls over said mounting plate and having an opening for each said standoff, said openings being sized and shaped to receive said base of said standoffs, whereby said alignment plate is placed over said mounting plate, said bases of said standoffs are placed in said openings, and said bases are fastened to said mounting plate with said standoff fasteners to align said standoffs and precisely locate said circuit board.

19. The enclosure as set forth in claim 18 wherein said base of each said standoff has a non-symmetrical shape and each said opening has a shape to match said base, whereby reversal of said standoffs is prevented.

20. The enclosure as set forth in claim 19 wherein said base of each said standoff has at least one locating indentation off-center relative to said base, such that the distance from said locating indentation to said first end is different from the distance from said locating indentation to said second end, and said alignment plate has a projection for each said opening to match said locating indentation, whereby said locating indentation and said projection prevent reversal of each said standoff.

21. An enclosure for mounting a circuit board with a communication interface connector, comprising:

a bottom defining a mounting plate having a plurality of spaced slits, a front wall projecting upwardly from said bottom, and having a plurality of spaced ports, spaced, opposed side walls projecting upwardly from said bottom and extending rearwardly from said front wall, a back wall projecting upwardly from said bottom and extending between said side walls, a plurality of standoffs each having an elongated base with a first end and a spaced second end, and a post that projects upwardly from said first end of said base, said base having an elongated standoff aperture that extends through said base between said post and said second end of said base, said base having at least one locating indentation off-center relative to said base, such that the distance from said locating indentation to said first end is different from the distance from said locating indentation to said second end, said post having a top and a hole extending downwardly from said top for receiving a board fastener for securing said circuit board to said top of said standoff, and a standoff fastener for each said standoff, said standoff fastener being sized to extend through said standoff aperture and into one of said slits to fasten said standoff to said mounting plate, whereby said standoffs can be mounted along said slits and rotated about said fasteners to mount said circuit board in said enclosure and align said communication interface connector with one of said ports.

* * * * *